(12) United States Patent
Kikuchi et al.

(10) Patent No.: US 11,618,341 B2
(45) Date of Patent: Apr. 4, 2023

(54) POWER CONTROL SYSTEM, ELECTRIC POWERED VEHICLE, AND POWER CONTROL METHOD

(71) Applicant: TOYOTA JIDOSHA KABUSHIKI KAISHA, Toyota (JP)

(72) Inventors: Yoshiaki Kikuchi, Toyota (JP); Junichi Matsumoto, Toyota (JP); Akio Uotani, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 213 days.

(21) Appl. No.: 16/950,405

(22) Filed: Nov. 17, 2020

(65) Prior Publication Data

US 2021/0188121 A1    Jun. 24, 2021

(30) Foreign Application Priority Data

Dec. 19, 2019  (JP) .............................. JP2019-229540

(51) Int. Cl.
| | |
|---|---|
| H02J 7/00 | (2006.01) |
| B60L 58/13 | (2019.01) |
| G01R 31/36 | (2020.01) |
| H01M 10/44 | (2006.01) |

(52) U.S. Cl.
CPC .......... B60L 58/13 (2019.02); G01R 31/3648 (2013.01); H01M 10/441 (2013.01); H02J 7/00712 (2020.01); *H01M 2220/20* (2013.01)

(58) Field of Classification Search
USPC .......................... 320/131, 132, 133, 134, 135
See application file for complete search history.

(56) References Cited

U.S. PATENT DOCUMENTS

| | | | | |
|---|---|---|---|---|
| 2012/0047386 | A1* | 2/2012 | Matsui | ................ H01M 16/006 |
| | | | | 713/340 |
| 2014/0277877 | A1 | 9/2014 | Sheidler et al. | |
| 2018/0095137 | A1 | 4/2018 | Yoshioka et al. | |
| 2018/0143258 | A1 | 5/2018 | Kim et al. | |
| 2019/0127867 | A1* | 5/2019 | Yonezawa | ................. C25B 1/04 |
| 2021/0188118 | A1* | 6/2021 | Kikuchi | ................ H02J 7/0047 |
| 2021/0188121 | A1* | 6/2021 | Kikuchi | .................. B60L 58/10 |

FOREIGN PATENT DOCUMENTS

| | | | |
|---|---|---|---|
| JP | 2013188100 A | * | 9/2013 |
| JP | 2019-156007 A | | 9/2019 |

\* cited by examiner

*Primary Examiner* — Brian Ngo
(74) *Attorney, Agent, or Firm* — Oliff PLC

(57) ABSTRACT

A power control system, configured to exchange electric power with a battery pack, comprising: a power conversion device; and a controller, wherein the battery pack is configured to output a variation of a state-of-charge value among cells to the controller, the variation being determined based on at least one of a detection result from a voltage sensor or a detection result from a current sensor, and the controller is configured to control the power conversion device such that a maximum state-of-charge value among a plurality of the state-of-charge values of the cells is lower than an upper limit of a predetermined state-of-charge range and a minimum state-of-charge value among the state-of-charge values of the cells is higher than a lower limit of the predetermined state-of-charge range, the maximum state-of-charge value and the minimum state-of-charge value being values based on the variation.

7 Claims, 8 Drawing Sheets

POWER CONTROL SYSTEM, ELECTRIC POWERED VEHICLE, AND POWER CONTROL METHOD

CROSS-REFERENCE TO RELATED APPLICATION

This application claims priority to Japanese Patent Application No. 2019-229540 filed on Dec. 19, 2019, incorporated herein by reference in its entirety.

BACKGROUND

1. Technical Field of the Disclosure

The present disclosure relates to a power control system, an electric powered vehicle, and a power control method.

2. Description of Related Art

In recent years, electric powered vehicles including driving battery packs have been used widely. Examples of the electric powered vehicles include hybrid vehicles (HVs) and electric vehicles. Typical electric powered vehicles include a plurality of electronic control units (ECUs) separately provided for individual functions.

For example, Japanese Unexamined Patent Application Publication No. 2019-156007 (JP 2019-156007 A) discloses a hybrid vehicle including an engine ECU, a motor ECU, a battery ECU, and an HV ECU. The HV ECU is connected to the engine ECU, the motor ECU, and the battery ECU via a communication port to exchange various control signals and data with the engine ECU, the motor ECU, and the battery ECU.

SUMMARY

It is assumed that the electric powered vehicle includes two systems. Those systems are referred to as a "battery system" and a "power control system". The battery system (battery pack) includes an assembled battery, and manages the condition of the assembled battery. The power control system controls electric power to be charged into and discharged from the assembled battery.

The battery system includes an assembled battery, a plurality of voltage sensors, a current sensor, and a first controller. The assembled battery includes a plurality of cells. The voltage sensors are provided in association with the respective cells. The voltage sensors output, to the first controller, results of detection of voltages of corresponding cells. The current sensor outputs, to the first controller, a result of detection of a current input to or output from the assembled battery. Thus, the first controller can calculate states of charge (SOCs) of the cells.

The power control system includes a power conversion device (converter or inverter) and a second controller. The power conversion device is electrically connected to the battery pack. The second controller controls charging and discharging of the assembled battery by outputting a control command to the power conversion device depending on the SOC of the battery pack.

The automotive industry has a vertically integrated industrial structure. Along with a further spread of electric powered vehicles throughout the world in the future, the manufacture of the electric powered vehicles may increasingly be shared horizontally. The inventors have focused on the following problem that may arise when the industrial structure changes.

A business entity that deals with the battery system (hereinafter referred to as Company A) may differ from a business entity that deals with the power control system (hereinafter referred to as Company B). For example, Company B sells the power control system to Company A. Company A develops an electric powered vehicle by combining the battery control system purchased from Company B with the battery system designed by Company A.

In this case, a problem may arise as to what type of data is exchanged between the battery system and the power control system. More specifically, the SOCs may vary among the cells in the battery pack along with use of the battery pack. From the viewpoint of appropriate protection and use of the battery pack, the SOCs of all the cells that are calculated by the first controller may be output from the battery system to the power control system. In general, the on-board battery pack includes many cells (for example, several tens to several hundreds of cells). Depending on the business entity, it may be undesirable to exchange the SOCs of all the cells in consideration of an increase in a calculation load and/or a communication load.

The present disclosure provides a technology for appropriately controlling the charging and discharging of the assembled battery without exchanging the SOCs of all the cells between the battery system and the power control system.

A power control system according to a first aspect of the present disclosure is configured to exchange electric power with a battery pack (battery system). The battery pack includes an assembled battery including a plurality of cells; a voltage sensor configured to detect voltages of the cells; and a current sensor configured to detect a current input to or output from the cells. The power control system includes: a power conversion device configured to charge and discharge the assembled battery; and a controller configured to control the power conversion device, wherein the battery pack is configured to output a variation of a state-of-charge value among the cells to the controller, the variation being determined based on at least one of a detection result from the voltage sensor or a detection result from the current sensor, and the controller is configured to control the power conversion device such that a maximum state-of-charge value among a plurality of the state-of-charge values of the cells calculated based on an output of the battery pack is lower than an upper limit of a predetermined state-of-charge range and a minimum state-of-charge value among the state-of-charge values of the cells is higher than a lower limit of the predetermined state-of-charge range, the maximum state-of-charge value and the minimum state-of-charge value being values based on the variation.

An electric powered vehicle according to a second aspect of the present disclosure includes the power control system and the battery pack.

An electric powered vehicle according to a third aspect of the present disclosure includes a battery system and a power control system configured to exchange electric power with the battery system. The battery system includes: an assembled battery including a plurality of cells; a voltage sensor configured to detect voltages of the cells; a current sensor configured to detect a current input to or output from the cells; and a first controller configured to receive detection results from the voltage sensor and the current sensor, the power control system includes: a power conversion device configured to charge and discharge the assembled battery; and a second controller configured to control the power conversion device, the first controller is configured to output a variation of a state-of-charge value among the cells to the second controller, the variation being determined based on at least one of a detection result from the voltage sensor or a detection result from the current sensor, and the second controller is configured to control the power conversion device such that a maximum state-of-charge value among a plurality of the state-of-charge values of the cells calculated based on an output of the first controller is lower than an upper limit of a predetermined state-of-charge range and a minimum state-of-charge value among the state-of-charge values of the cells is higher than a lower limit of the predetermined state-of-charge range, the maximum state-of-charge value and the minimum state-of-charge value being values based on the variation.

A power control method according to a fourth aspect of the present disclosure is a method for exchanging electric power between a battery system and a power control system. The battery system includes: an assembled battery including a plurality of cells; a voltage sensor configured to detect voltages of the cells; a current sensor configured to detect a current input to or output from the cells; and a first controller configured to receive detection results from the voltage sensor and the current sensor, and the power control system includes: a power conversion device configured to charge and discharge the assembled battery; and a second controller configured to control the power conversion device. The power control method includes: outputting a variation of a state-of-charge value among the cells from the first controller to the second controller, the variation being determined based on at least one of a detection result from the voltage sensor or a detection result from the current sensor; and controlling the power conversion device by the second controller such that a maximum state-of-charge value among a plurality the state-of-charge values of the cells calculated based on an output of the first controller is lower than an upper limit of a predetermined state-of-charge range and a minimum state-of-charge value among the state-of-charge values of the cells is higher than a lower limit of the predetermined state-of-charge range, the maximum state-of-charge value and the minimum state-of-charge value being values based on the variation.

According to the present disclosure, the charging and discharging of the battery pack can appropriately be controlled without exchanging the SOCs of all the cells between the battery system and the power control system.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
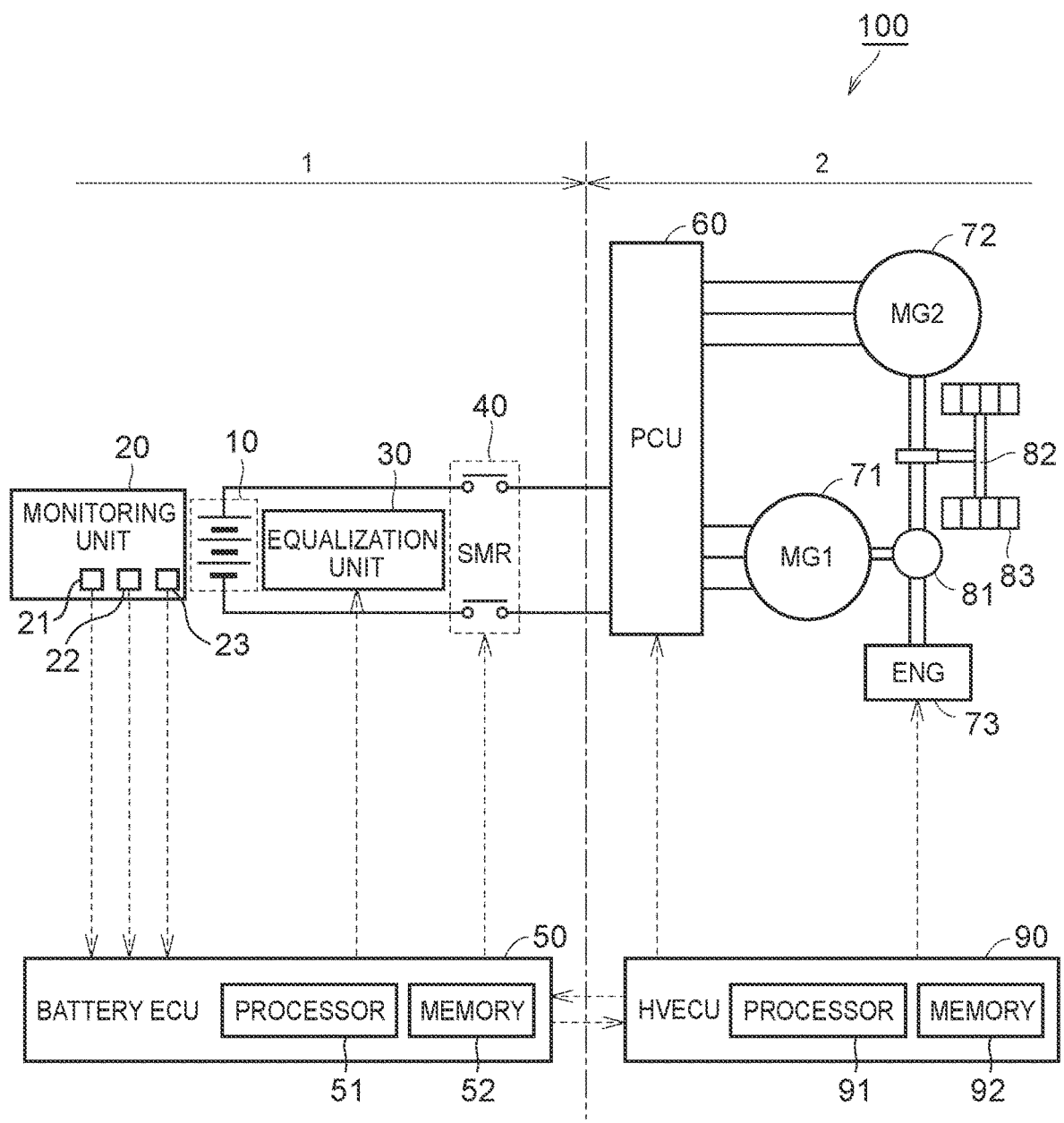
FIG. 1 is a diagram schematically illustrating the overall configuration of an electric powered vehicle including a power control system according to an embodiment.

Embodiments are described below in detail with reference to the drawings. In the drawings, the same or corresponding parts are represented by the same reference symbols to omit redundant description.

First Embodiment

Overall Configuration of Electric Powered Vehicle

FIG. 1 is a diagram schematically illustrating the overall configuration of an electric powered vehicle including a power control system according to an embodiment. Referring to FIG. 1, a vehicle 100 is a hybrid vehicle including a battery pack 1 and an HV system 2. The electric powered vehicle according to the present disclosure is not limited to the hybrid vehicle, but may be an electric vehicle or a fuel cell vehicle.

The battery pack 1 includes an assembled battery 10, a monitoring unit 20, an equalization unit 30, a system main relay (SMR) 40, and a battery ECU 50. The HV system 2 includes a power control unit (PCU) 60, motor generators 71 and 72, an engine 73, a power split device 81, a driving shaft 82, driving wheels 83, and an HV ECU 90. The battery pack 1 is one of examples for a "battery system" according to the present disclosure. The HV system 2 is one of examples for a "power control system" according to the present disclosure.

Figure 2:
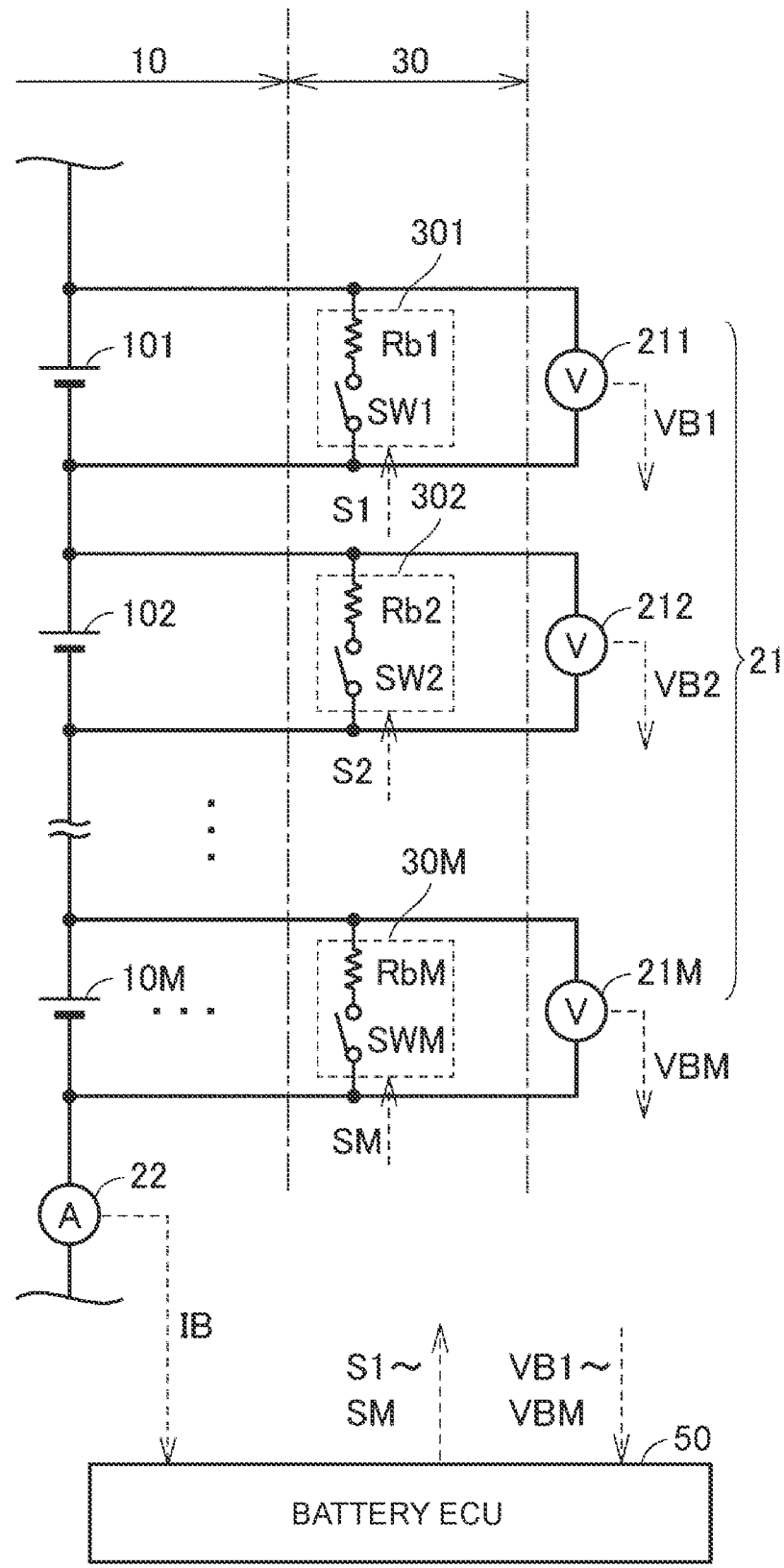
FIG. 2 is a diagram for describing details of the structure of a battery pack.

The assembled battery 10 includes a plurality of cells 101 to 10M (see FIG. 2). The cells 101 to 10M are secondary batteries such as lithium ion batteries or nickel-metal hydride batteries. The assembled battery 10 stores electric power for driving the motor generators 71 and 72, and supplies the electric power to the motor generators 71 and 72 through the PCU 60. When the motor generators 71 and 72 generate electric power, the assembled battery 10 is charged by receiving the generated electric power through the PCU 60.

The monitoring unit 20 includes a voltage sensor 21 (plurality of voltage sensors 211 to 21M described later), a current sensor 22, and a temperature sensor 23. The voltage sensor 21 detects voltages of the cells in the assembled battery 10. The current sensor 22 detects a current IB input to or output from the assembled battery 10. The temperature sensor 23 detects the temperature of the assembled battery 10. The sensors output detection results to the battery ECU 50.

The equalization unit 30 is provided to eliminate an inequality of SOCs among the cells 101 to 10M in the assembled battery 10. More specifically, the SOCs may vary among the cells 101 to 10M in the assembled battery 10 along with use or elapse of time. Examples of the cause of the SOC variation include a variation in self-discharge currents of the cells 101 to 10M, or a variation in currents consumed by the voltage sensors 211 to 21M. The equalization unit 30 discharges any cell out of the cells 101 to 10M to eliminate the SOC inequality in response to a control command from the battery ECU 50. Detailed structures of the assembled battery 10, the monitoring unit 20, and the equalization unit 30 are described with reference to FIG. 2. The SOC and an open circuit voltage (OCV) have a correlation in which the OCV monotonously increases along with an increase in the SOC. Therefore, the OCVs may be equalized instead.

The SMR 40 is electrically connected to power lines connecting the PCU 60 and the assembled battery 10. The SMR 40 switches supply and interruption of electric power between the PCU 60 and the assembled battery 10 in response to a control command from the battery ECU 50.

The battery ECU 50 includes a processor 51 such as a central processing unit (CPU), a memory 52 such as a read only memory (ROM) and a random access memory (RAM), and an input and output port (not illustrated) for inputting or outputting various signals. The battery ECU 50 monitors the condition of the assembled battery 10 based on signals received from the sensors of the monitoring unit 20 and programs and maps (described later) stored in the memory 52. Processes to be executed by the battery ECU 50 mainly include a process of calculating SOCs of the cells in the assembled battery 10. Details of this process are described later. The battery ECU 50 is one of examples for a "first controller" according to the present disclosure.

The PCU 60 executes bidirectional power conversion between the assembled battery 10 and each of the motor generators 71 and 72 in response to a control signal from the HV ECU 90. The PCU 60 can individually control the conditions of the motor generators 71 and 72. For example, the PCU 60 can bring the motor generator 71 into a regenerative state (power generating state), and the motor generator 72 into a power running state. For example, the PCU 60 includes two inverters (not illustrated) provided in association with the motor generators 71 and 72, and a converter (not illustrated) configured to step up a direct-current (DC) voltage supplied to each inverter into a voltage equal to or higher than an output voltage of the assembled battery 10. The PCU 60 is one of examples for a "power conversion device" according to the present disclosure.

Each of the motor generators 71 and 72 is an alternating-current (AC) rotating electrical machine, as typified by a three-phase AC synchronous motor having permanent magnets embedded in a rotor. The motor generator 71 is mainly used as a generator to be driven by the engine 73 via the power split device 81. Electric power generated by the motor generator 71 is supplied to the motor generator 72 or the assembled battery 10 via the PCU 60. The motor generator 71 may crank the engine 73.

The motor generator 72 operates mainly as an electric motor to drive the driving wheels 83. The motor generator 72 is driven by receiving at least one of electric power from the assembled battery 10 and electric power generated by the motor generator 71, and a driving force of the motor generator 72 is transmitted to the driving shaft 82. When the vehicle is braked or the acceleration is reduced along a downslope, the motor generator 72 operates as a generator to regenerate electric power. The electric power generated by the motor generator 72 is supplied to the assembled battery 10 via the PCU 60.

The engine 73 converts combustion energy generated by burning an air-fuel mixture into kinetic energy of kinetic elements such as a piston and a rotor so as to output driving power.

For example, the power split device 81 includes a planetary gearing mechanism (not illustrated) having three rotation axes of a sun gear, a carrier, and a ring gear. The power split device 81 splits driving power output from the engine 73 into driving power for driving the motor generator 71 and driving power for driving the driving wheels 83.

The HV ECU 90 includes a processor 91 such as a CPU, a memory 92 such as a ROM and a RAM, and an input and output port (not illustrated) similarly to the battery ECU 50. The HV ECU 90 controls the devices in the HV system 2 based on data from the battery ECU 50 and programs and maps stored in the memory 92. The control to be executed by the HV ECU 90 mainly includes charging and discharging control for the assembled battery 10. The charging and discharging control is described later. The HV ECU 90 is one of examples for a "controller" or a "second controller" according to the present disclosure. The HV ECU 90 may be divided into a plurality of ECUs (engine ECU and other ECUs) depending on functions as described in JP 2019-156007 A.

Structure of Battery Pack

FIG. 2 is a diagram for describing details of the structure of the battery pack 1. Referring to FIG. 2, the assembled battery 10 includes, for example, M cells 101 to 10M connected in series. The number "M" is not particularly limited as long as M is a natural number equal to or larger than 2, but typically represents a dozen or several tens of cells.

Although illustration is omitted, adjacent cells are electrically connected and mechanically coupled together by a bus bar. A fuse (not illustrated) is connected in series to each cell. The fuse interrupts a current path of the cell when an excessive current flows. A current interrupt device (CID) (not illustrated) is provided inside each cell. The CID interrupts the current path when the pressure in a battery case is equal to or higher than a predetermined value.

The voltage sensor 211 detects a voltage VB1 of the cell 101. The voltage sensor 212 detects a voltage VB2 of the cell 102. The same applies to the other voltage sensors 213 to 21M. The current sensor 22 detects the current IB flowing through the cells 101 to 10M.

The equalization unit 30 includes equalization circuits 301 to 30M. The equalization circuit 301 is connected in parallel to the cell 101. The equalization circuit 301 includes a bypass resistor Rb1 and a switching element (such as a transistor) SW1 similarly to general equalization circuits. The same applies to the other equalization circuits 302 to 30M.

When the voltages VB1 to VBM of the cells 101 to 10M are acquired from the voltage sensors 211 to 21M, the battery ECU 50 controls the equalization circuits 301 to 30M such that respective blocks are discharged until the voltages VB1 to VBM are substantially equal to each other. This control is referred to as "equalization control". In FIG. 2, Si to SM represent control commands for the equalization control. By executing the equalization control as appropriate, the SOC inequality (variation) among the cells 101 to 10M can be eliminated.

In FIG. 2, the structure of the assembled battery 10 having all the cells connected in series is described as an example, but the connection relationship among the cells is not limited to this relationship. For example, the assembled battery 10 may include a plurality of blocks each having a plurality of cells connected in series. In this case, the blocks are connected in parallel. Alternatively, the assembled battery 10 may include a plurality of blocks each having a plurality of cells connected in parallel. In this case, the blocks are connected in series. In the first embodiment, the equalization unit 30 is not an essential component.

Interface Between Battery ECU and HV ECU

For example, it is assumed that a first business entity develops the vehicle 100 by purchasing the HV system 2 from a second business entity and combining the HV system 2 with the battery pack 1 designed or acquired by the first business entity. In this case, a problem may arise as to what type of data is exchanged between the battery pack 1 and the HV system 2, that is, between the battery ECU 50 and the HV ECU 90. The battery ECU 50 may output SOCs of all the cells 101 to 10M to the HV ECU 90. Depending on the business entity, however, it may be undesirable to exchange (transmit and receive) SOCs of all the cells in consideration of an increase in a calculation load and/or a communication load.

In this embodiment, the battery ECU 50 and the HV ECU 90 are configured such that an index indicating the degree of a variation in the SOCs among the cells 101 to 10M is output in addition to an average of the SOCs of all the cells 101 to 10M. The average of the SOCs is referred to as an "average SOC (AVE)" or simply as "AVE". The index indicating the degree of the variation in the SOCs is referred to as an "SOC variation VAR". By using not only the average SOC (AVE) but also the SOC variation VAR, an excessive increase or decrease in the SOC of the assembled battery 10 can be suppressed and the assembled battery 10 can appropriately be protected while avoiding an increase in the load as described below.

Charging and Discharging Control Flow

Figure 3:
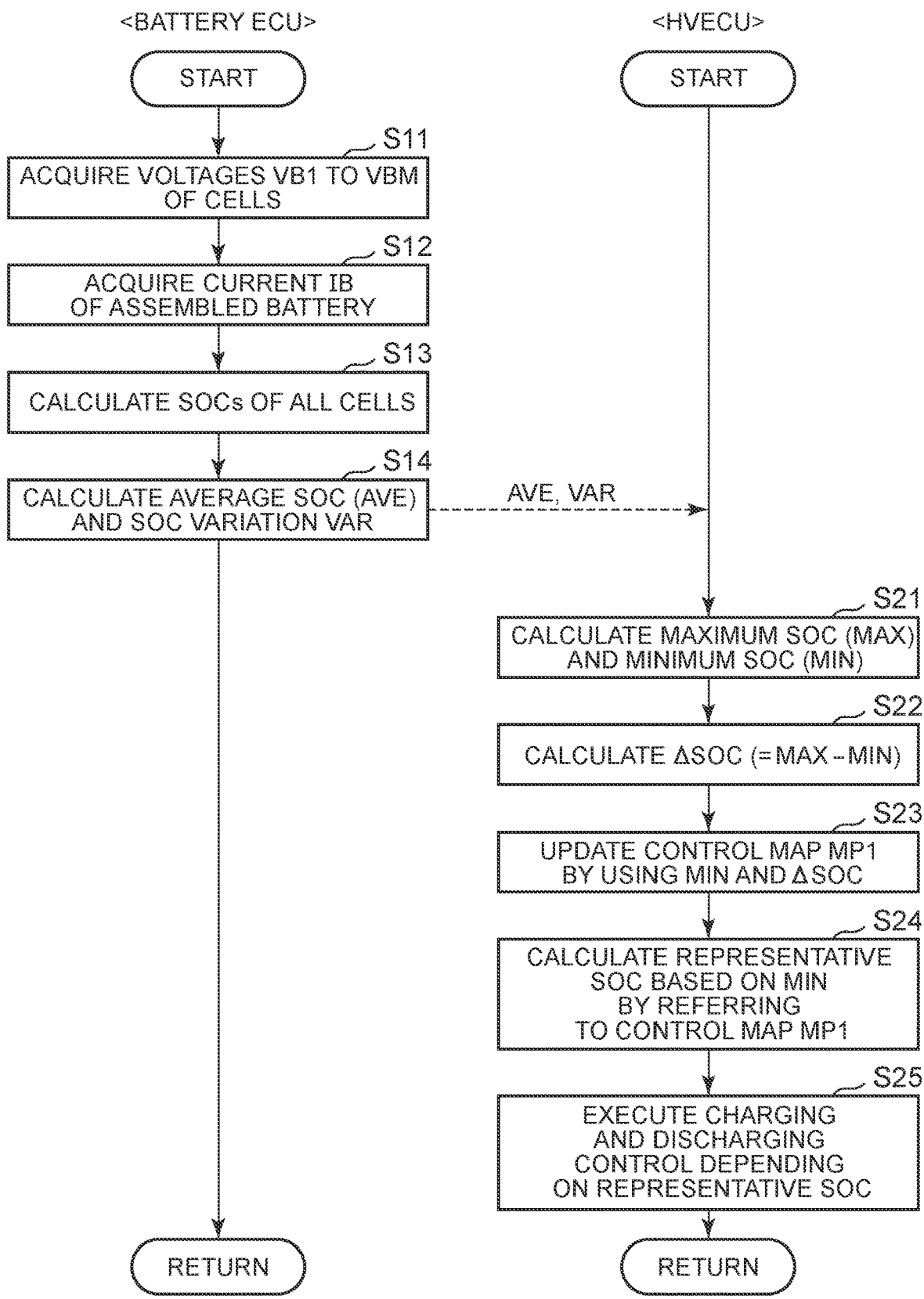
FIG. 3 is a flowchart illustrating a procedure of a charging and discharging control process for an assembled battery according to a first embodiment.

FIG. 3 is a flowchart illustrating a procedure of a charging and discharging control process for the assembled battery 10 according to the first embodiment. The left side of FIG. 3 is a series of processes to be executed by the battery ECU 50. The right side of FIG. 3 is a series of processes to be executed by the HV ECU 90.

Figure 10:
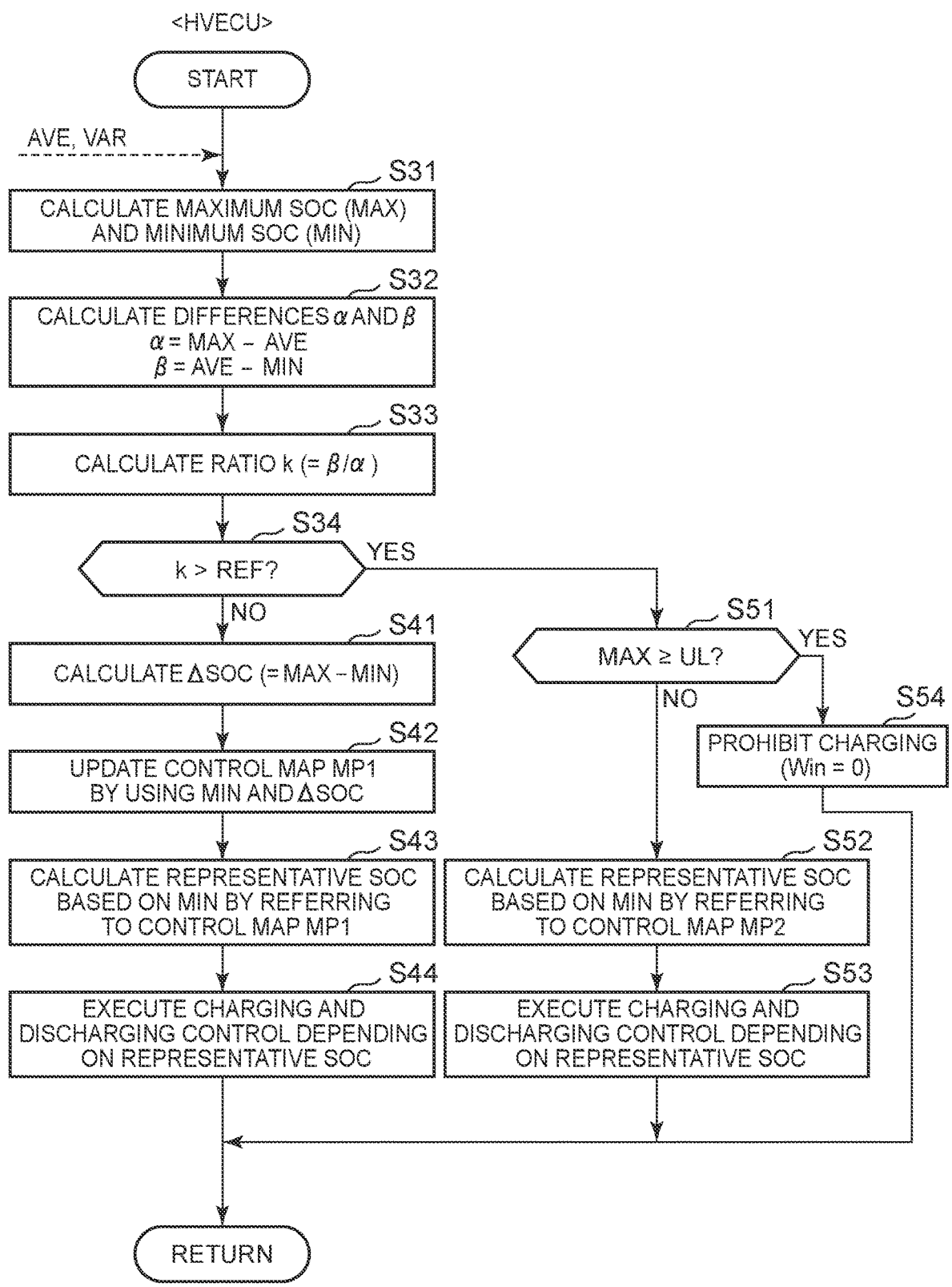
FIG. 10 is a flowchart illustrating a procedure of a charging and discharging control process for the assembled battery according to the second embodiment.

Processes in the flowchart of FIG. 3 and a flowchart of FIG. 10 are executed by being called from a main routine (not illustrated) when a predetermined condition is satisfied or every time a predetermined calculation period elapses. Steps in each flowchart are basically implemented by a software process of the ECU (battery ECU 50 or HV ECU 90), but may be implemented by a hardware process of an electronic circuit in the ECU. Each step is hereinafter abbreviated as "S".

In S11 of FIG. 3, the battery ECU 50 acquires voltages VB1 to VBM of the cells 101 to 10M from the voltage sensors 211 to 21M, respectively. The battery ECU 50 also acquires a current IB flowing through the assembled battery 10 from the current sensor (S12).

In S13, the battery ECU 50 calculates SOCs of all the cells 101 to 10M based on at least one of the voltages VB1 to VBM of the cells 101 to 10M and the current IB. The SOCs may be calculated by various publicly-known methods such as a method using a predetermined SOC-OCV characteristic curve or a method of summing currents IB input to or output from the assembled battery 10.

In S14, the battery ECU 50 calculates an average SOC (AVE) of all the cells 101 to 10M and an SOC variation VAR among the cells 101 to 10M (details are described later). The battery ECU 50 outputs the average SOC (AVE) and the SOC variation VAR to the HV ECU 90. When the average SOC (AVE) and the SOC variation VAR are received from the battery ECU 50, the HV ECU 90 starts processes for calculating an SOC to be used in the charging and discharging control for the assembled battery 10 (S21, S22).

Figure 4A:
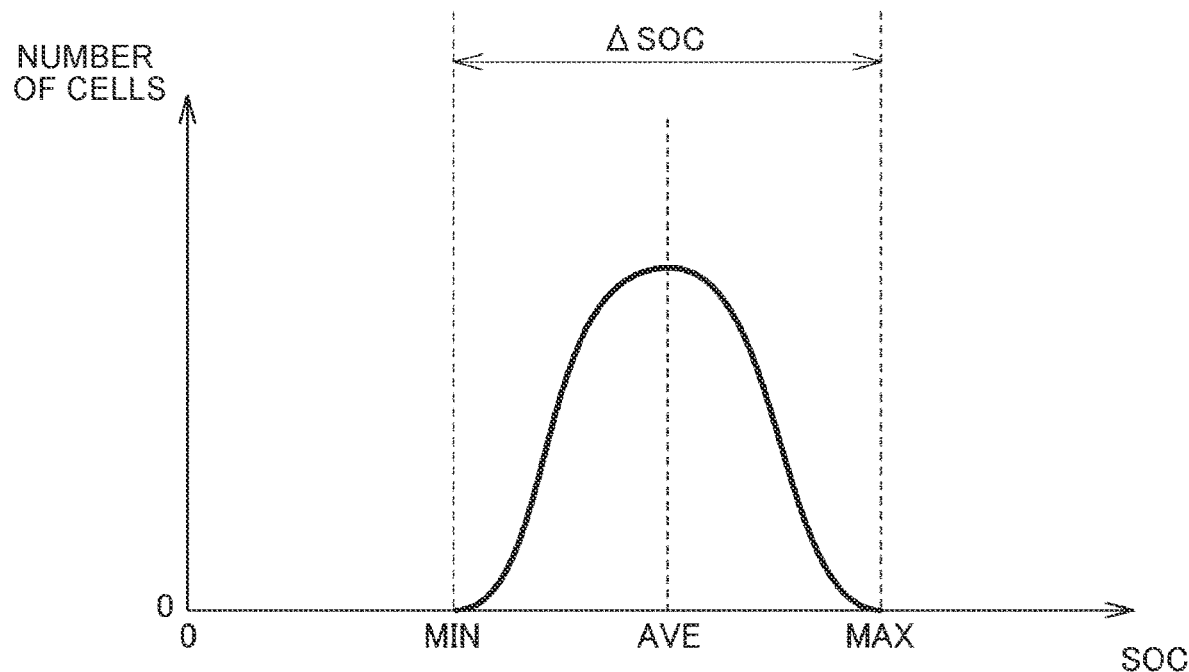
FIG. 4A is a conceptual diagram for describing processes of S21 and S22 to be executed by an HV ECU.
Figure 4B:
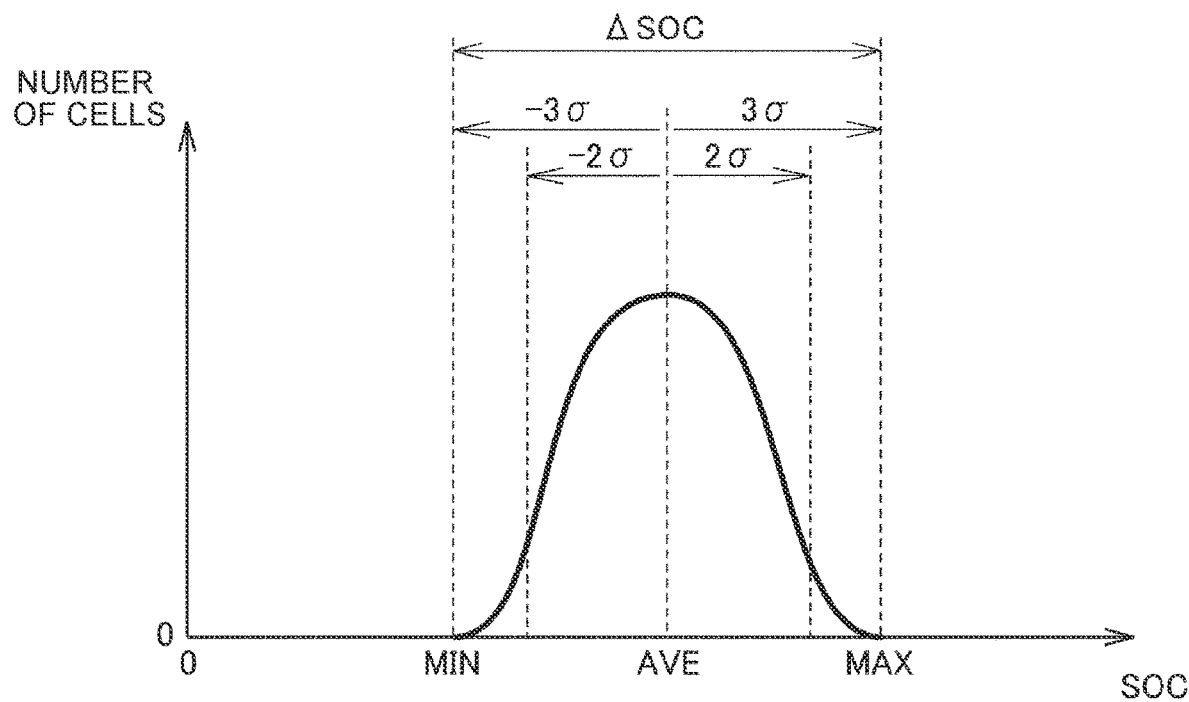
FIG. 4B is a conceptual diagram for describing processes of S21 and S22 to be executed by an HV ECU.

FIG. 4A and FIG. 4B are conceptual diagrams for describing processes of S21 and S22 to be executed by the HV ECU 90. In FIG. 4A and FIG. 4B, and FIG. 5 and FIG. 8 to be described later, the horizontal axis represents an SOC of each cell in the assembled battery 10. The vertical axis represents the number of cells for each SOC.

Referring to FIG. 4A and FIG. 4B, it can be assumed that the SOCs of normal cells 101 to 10M are plotted in accordance with a normal distribution. The maximum value of the SOC is referred to as a "maximum SOC (MAX)" or simply as "MAX". The minimum value of the SOC is referred to as a "minimum SOC (MIN)" or simply as "MIN".

In the example illustrated in FIG. 4A, the maximum SOC (MAX) and the minimum SOC (MIN) are output from the battery ECU 50 to the HV ECU 90 as the SOC variation VAR. In this case, the HV ECU 90 can directly use the maximum SOC (MAX) and the minimum SOC (MIN) received from the battery ECU 50 (S21). In this example, the average SOC (AVE) is not used for calculating the maximum SOC (MAX) and the minimum SOC (MIN), and therefore the battery ECU 50 need not output the average SOC (AVE).

The index to be used as the SOC variation VAR is not limited to the maximum SOC (MAX) and the minimum SOC (MIN). As in the example illustrated in FIG. 4B, a standard deviation σ of the SOCs of the cells 101 to 10M may be output from the battery ECU 50 to the HV ECU 90. The HV ECU 90 can calculate the maximum SOC (MAX) and the minimum SOC (MIN) based on the average SOC (AVE) and the standard deviation σ (S21). Specifically, the maximum SOC (MAX) and the minimum SOC (MIN) can be calculated based on Expression (1) and Expression (2).

$$\text{MAX}=\text{AVE}+3\sigma \quad (1)$$

$$\text{MIN}=\text{AVE}-3\sigma \quad (2)$$

The maximum SOC (MAX) and the minimum SOC (MIN) may be calculated within ±2σ ranges in place of the ±3σ ranges. Further, a parameter different from the standard deviation σ and indicating a statistical variation (for example, a variance) may be transmitted and received.

In S22 of FIG. 3, the HV ECU 90 calculates an SOC difference ΔSOC between the maximum SOC (MAX) and the minimum SOC (MIN) based on Expression (3).

$$\Delta\text{SOC}=\text{MAX}-\text{MIN} \quad (3)$$

Figure 5:
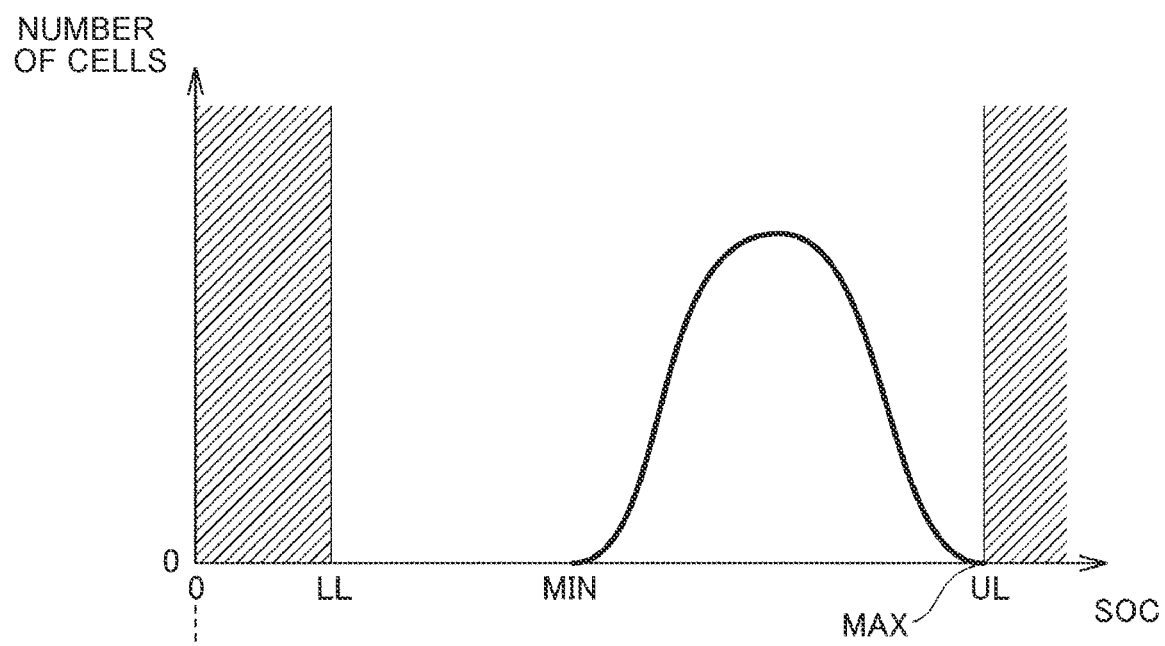
FIG. 5 is a diagram for describing an SOC range available for charging and discharging of the assembled battery.
Figure 5:
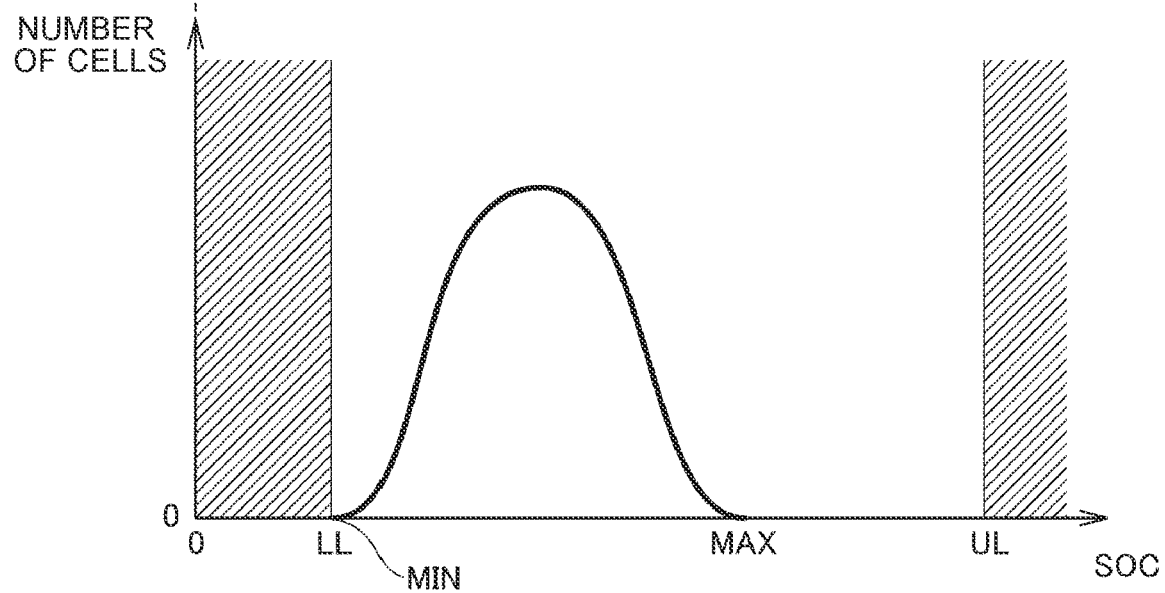

FIG. 5 is a diagram for describing an SOC range available for charging and discharging of the assembled battery 10. Referring to FIG. 5, an SOC range permitted for use in the assembled battery 10 is determined in advance. A lower limit of the SOC range is referred to as a "permissible lower limit SOC (LL)" or simply as "LL". An upper limit of the SOC range is referred to as a "permissible upper limit SOC (UL)" or simply as "UL". For example, LL is 20% and UL is 80%. In FIG. 5, ranges outside the SOC range are hatched to indicate that those ranges are unavailable.

The HV ECU 90 controls charging and discharging of the assembled battery 10 such that the maximum SOC (MAX) is not higher than the permissible upper limit SOC (UL) and the minimum SOC (MIN) is not lower than the permissible lower limit SOC (LL). To prevent complication of control, the HV ECU 90 uses a control SOC in the charging and discharging control for the assembled battery 10. The control SOC is a single SOC representative of the SOCs varying in accordance with the normal distribution. The control SOC is hereinafter referred to as a "representative SOC".

Figure 6:
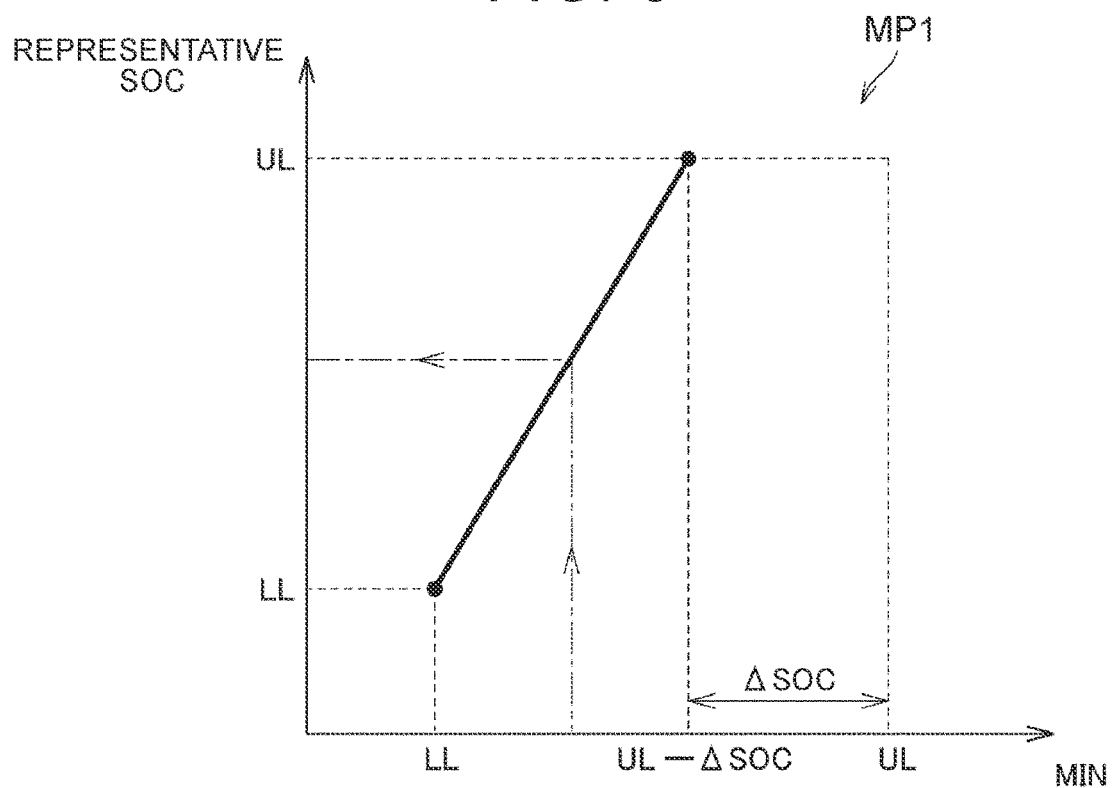
FIG. 6 is a diagram for describing an example of a representative SOC calculation method according to the first embodiment.
Figure 9:
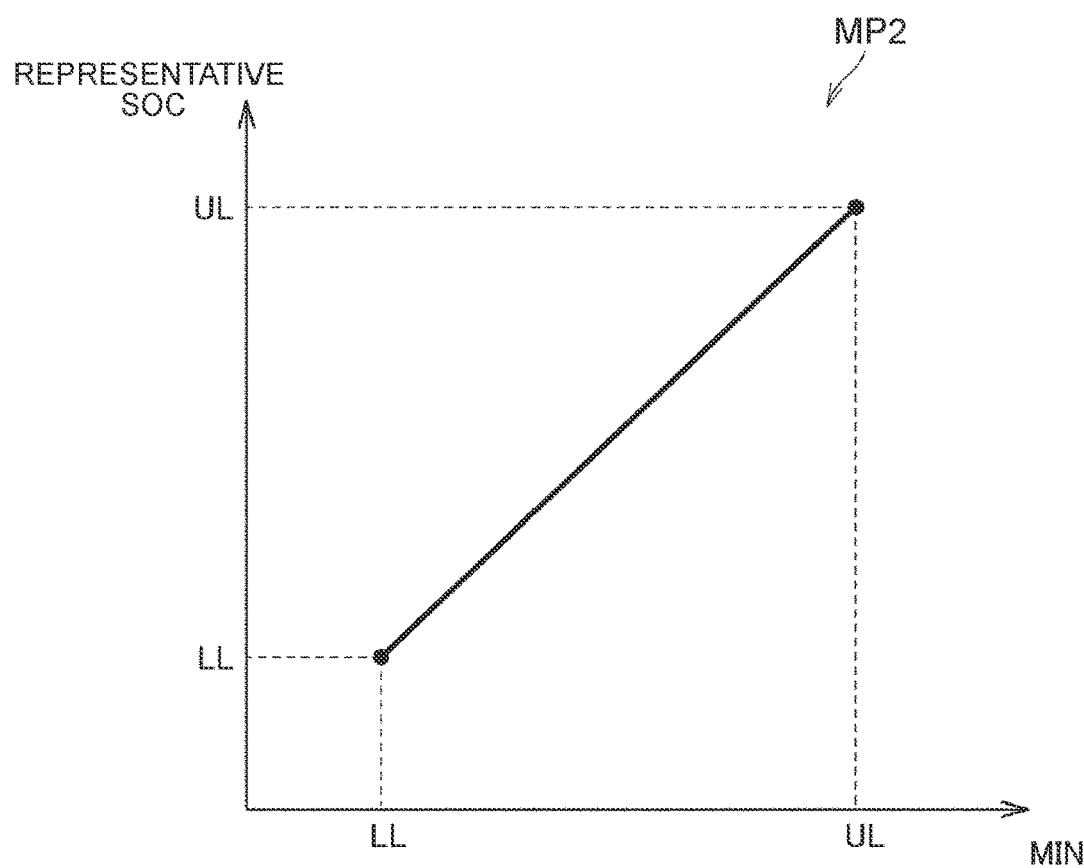
FIG. 9 is a conceptual diagram illustrating a control map according to the second embodiment.

FIG. 6 is a diagram for describing an example of a representative SOC calculation method according to the first embodiment. In FIG. 6 and FIG. 9, the horizontal axis represents the minimum SOC (MIN). The vertical axis represents the representative SOC.

Referring to FIG. 6, the representative SOC (corresponding to a "first representative SOC" according to the present disclosure) is calculated based on the minimum SOC (MIN). More specifically, the HV ECU 90 calculates (UL−ΔSOC) by subtracting the difference ΔSOC calculated based on Expression (3) from the permissible upper limit SOC (UL), which is a fixed value. Then, the HV ECU 90 determines a relational expression represented by a straight line connecting coordinates (LL, LL) and coordinates (UL−ΔSOC, UL).

The HV ECU 90 stores, in the memory 92, a control map MP1 that defines the relationship represented by the straight line (a table or a relational expression may be used in place of the map). The HV ECU 90 updates the control map MP1 every time the average SOC (AVE) and the SOC variation VAR are received from the battery ECU 50 (S23 of FIG. 3). The HV ECU 90 can convert the minimum SOC (MIN) into the representative SOC by referring to the control map MP1 (S24 of FIG. 3).

When the representative SOC is equal to the permissible lower limit SOC (LL), the minimum SOC (MIN) is also equal to the permissible lower limit SOC (LL) (MIN=LL) based on the control map MP1. Thus, a state in which the SOCs of all the cells 101 to 10M are equal to or higher than the permissible lower limit SOC (LL) is ensured when the HV ECU 90 controls discharging of the assembled battery 10 such that the representative SOC is not lower than the permissible lower limit SOC (LL).

When the representative SOC is equal to the permissible upper limit SOC (UL), the minimum SOC (MIN) is equal to (UL−ΔSOC) (MIN=UL−ΔSOC) based on the control map MP1. Since the maximum SOC (MAX) is higher than the minimum SOC (MIN) by ΔSOC, an expression "MAX=MIN+ΔSOC=(UL−ΔSOC)+ΔSOC=UL" holds. That is, when the representative SOC is equal to the permissible upper limit SOC (UL), the maximum SOC (MAX) is also equal to the permissible upper limit SOC (UL) (MAX=UL). Thus, a state in which the SOCs of all the cells 101 to 10M are equal to or lower than the permissible upper limit SOC (UL) is ensured when the HV ECU 90 controls charging of the assembled battery 10 such that the representative SOC is not higher than the permissible upper limit SOC (UL).

In FIG. 6, description is given of the example in which the horizontal axis represents the minimum SOC (MIN) and the relationship represented by the straight line connecting two points (LL, LL) and (UL−ΔSOC, UL) is used, but other methods may be employed.

Figure 7:
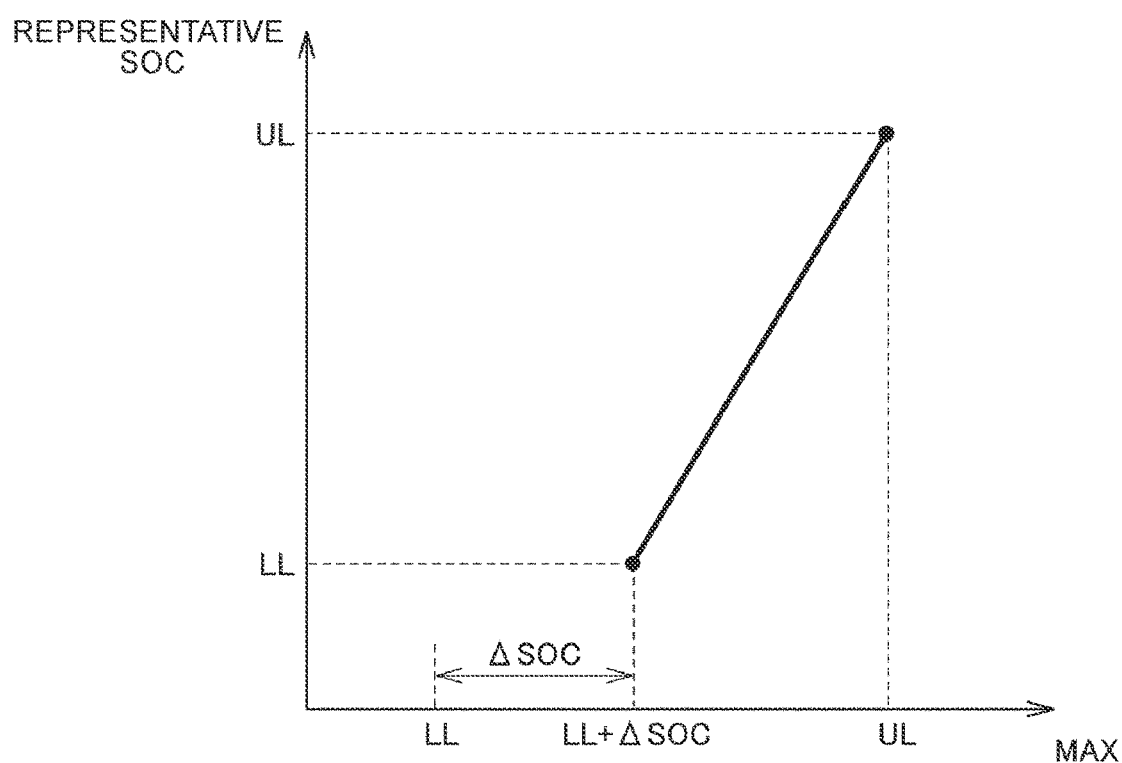
FIG. 7 is a diagram for describing another example of the representative SOC calculation method according to the first embodiment.

FIG. 7 is a diagram for describing another example of the representative SOC calculation method according to the first embodiment. As illustrated in FIG. 7, the horizontal axis may represent the maximum SOC (MAX), and a relationship represented by a straight line connecting coordinates (LL+ΔSOC, LL) and coordinates (UL, UL) may be used.

In the first embodiment described above, the average SOC (AVE) and the SOC variation VAR of the cells 101 to 10M are output from the battery ECU 50 to the HV ECU 90 in place of the SOCs of all the cells 101 to 10M. The HV ECU 90 calculates the maximum SOC (MAX) and the minimum SOC (MIN) based on the average SOC (AVE) and the SOC variation VAR (S21 of FIG. 3), and also calculates the difference ΔSOC between the maximum SOC (MAX) and the minimum SOC (MIN) (S22). The HV ECU 90 then updates the control map MP1 that defines the single SOC representative of the SOCs of all the cells 101 to 10M (see FIG. 6 or FIG. 7) based on the minimum SOC (MIN) and the difference ΔSOC (S23). The use of the control map MP1 achieves SOC management in which the SOCs of all the cells 101 to 10M do not fall out of the SOC range between the permissible lower limit SOC (LL) and the permissible upper limit SOC (UL). According to the first embodiment, the charging and discharging of the assembled battery 10 can be controlled appropriately.

Second Embodiment

In the first embodiment, the charging and discharging control for the assembled battery 10 is described under the assumption that all the cells 101 to 10M are normal. An abnormality may occur partially in the cells 101 to 10M. As a specific example, a small short circuit may occur because an electrode is broken by a foreign object (such as weld spatter or swarf) in the electrode. In a second embodiment, description is given of charging and discharging control adaptable to the case where a cell having an abnormality (abnormal cell) is included in the assembled battery 10.

In the second embodiment, the maximum SOC (MAX) and the minimum SOC (MIN) serve as the SOC variation VAR to be output from the battery ECU 50 to the HV ECU 90. The configuration of an electric powered vehicle according to the second embodiment is substantially the same as the configuration of the vehicle 100 according to the first embodiment (see FIG. 1 and FIG. 2). Therefore, redundant description is omitted.

Figure 8:
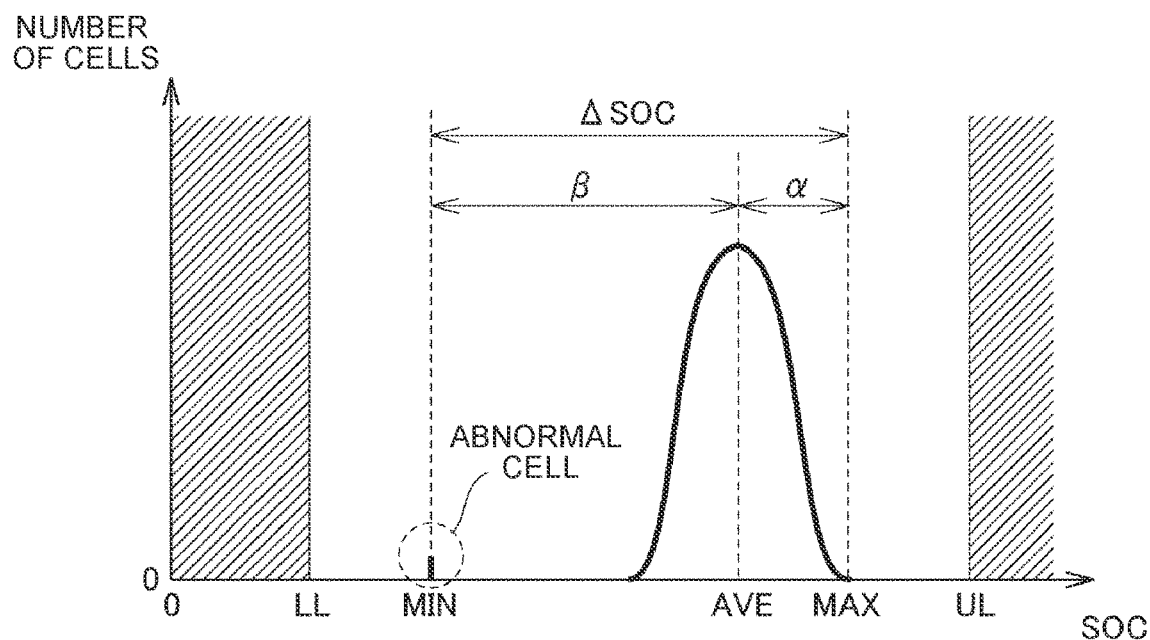
FIG. 8 is a conceptual diagram for describing a calculation process related to an SOC distribution according to a second embodiment.

FIG. 8 is a conceptual diagram for describing a calculation process related to an SOC distribution according to the second embodiment. Referring to FIG. 8, the SOC of the abnormal cell in this example is an outlier from the normal distribution of the SOC of a normal cell. The SOC of the abnormal cell is equal to the minimum SOC (MIN).

In the second embodiment, the HV ECU 90 calculates a difference α between the maximum SOC (MAX) and the average SOC (AVE), and a difference β between the average SOC (AVE) and the minimum SOC (MIN) (see Expression (4) and Expression (5)).

$$\alpha = MAX - AVE \quad (4)$$

$$\beta = AVE - MIN \quad (5)$$

The HV ECU 90 calculates a ratio k of the difference β to the difference α (=β/α). When the ratio k is higher than a predetermined reference value REF (k>REF), the HV ECU 90 determines that an abnormal cell exists. In this case, the HV ECU 90 updates a control map MP2 different from the control map MP1 described in the first embodiment (see FIG. 6).

FIG. 9 is a conceptual diagram illustrating the control map MP2 according to the second embodiment. Referring to FIG. 9, the control map MP2 is created based on a relationship represented by a straight line connecting a point (LL, LL) and a point (UL, UL). In short, the minimum SOC (MIN) is directly used as the representative SOC in the control map MP2.

When a cell having an abnormality such as a small short circuit is included in the assembled battery 10, the SOC change of the abnormal cell along with the charging and discharging of the assembled battery 10 differs from the SOC changes of the remaining normal cells. Therefore, the SOC variation among the cells may increase. As the SOC variation increases, it is more likely that the maximum SOC (MAX) reaches the permissible upper limit SOC (UL) or the minimum SOC (MIN) reaches the permissible lower limit SOC (LL). That is, an actual SOC range available for charging and discharging of the assembled battery 10 is narrow. Therefore, it is desirable to reduce the SOC variation. The equalization control can be executed by using the equalization unit 30.

Comparison is made between the control map MP1 and the control map MP2. It is likely that the SOC of the normal cell falls within a higher SOC range in a case where the control map MP2 is used than a case where the control map MP1 is used. Thus, the effect of the equalization control can be improved. The following two matters are conceivable as technical reasons. Firstly, the self-discharge current of the cell increases as the SOC of the cell increases. Secondly, a discharge current (bypass current) flowing through any bypass resistor (any of Rb1 to RbM in FIG. 2) during execution of the equalization control increases because the voltage increases as the SOC of the cell increases. By increasing the self-discharge current and the bypass current, movement of electric charge from a cell having a relatively high SOC to a cell having a relatively low SOC is promoted. Thus, the SOC inequality among the cells can be reduced effectively.

FIG. 10 is a flowchart illustrating a procedure of a charging and discharging control process for the assembled battery 10 according to the second embodiment. A series of processes to be executed by the battery ECU 50 in the second embodiment is similar to the processes in the first embodiment (see the left side of FIG. 3). Because of constraint on the drawing sheet, FIG. 10 only illustrates processes to be executed by the HV ECU 90.

In S31 of FIG. 10, the HV ECU 90 calculates a maximum SOC (MAX) and a minimum SOC (MIN) based on an average SOC (AVE) and an SOC variation VAR received from the battery ECU 50. As described above, the SOC variation VAR in the second embodiment is the maximum SOC (MAX) and the minimum SOC (MIN) themselves.

In S32, the HV ECU 90 calculates a difference $\alpha$ between the maximum SOC (MAX) and the average SOC (AVE), and a difference $\beta$ between the average SOC (AVE) and the minimum SOC (MIN).

In S33, the HV ECU 90 calculates a ratio k of the difference $\beta$ to the difference $\alpha$ ($=\beta/\alpha$). Then, the HV ECU 90 compares the calculated ratio k with the reference value REF (S34).

When the ratio k is equal to or lower than the reference value REF ("NO" in S34), the HV ECU 90 determines that no abnormal cell exists, and advances the process to S41. Processes of S41 to S44 are processes related to the control map MP1, and are substantially the same as the processes of S22 to S25 according to the first embodiment (see FIG. 3). Therefore, detailed description is not repeated.

When the ratio k is higher than the reference value REF ("YES" in S34), the HV ECU 90 determines that an abnormal cell exists, and advances the process to S51. When the control map MP2 is used, the effect of the equalization control is improved as described above. Unlike the use of the control map MP1, a state in which the maximum SOC (MAX) does not exceed the permissible upper limit SOC (UL) is not ensured. As a countermeasure, the HV ECU 90 determines whether the maximum SOC (MAX) reaches the permissible upper limit SOC (UL) (S51).

When the maximum SOC (MAX) is equal to or higher than the permissible upper limit SOC (UL) ("YES" in S51), permissible charging power Win of the assembled battery 10 is limited to 0. The charging of the assembled battery 10 is then prohibited. By preparing the control of setting the permissible charging power Win to 0 for the case where the maximum SOC (MAX) exceeds the permissible upper limit SOC (UL), the cells can be prevented from being charged excessively, and the assembled battery 10 can be protected appropriately.

When the maximum SOC (MAX) is lower than the permissible upper limit SOC (UL) ("NO" in S51), the HV ECU 90 advances the process to S52. In S52, the HV ECU 90 calculates a representative SOC (second representative SOC) based on the minimum SOC (MIN) by referring to the control map MP2. Specifically, the HV ECU 90 sets the representative SOC to be equal to the minimum SOC (MIN). The HV ECU 90 then executes charging and discharging control for the assembled battery 10 depending on the representative SOC (S53).

In the second embodiment described above, the control map MP1 and the control map MP2 are selectively used depending on whether an abnormal cell exists. When the ratio k is higher than the reference value REF, the control map MP2 is used in place of the control map MP1. Therefore, the effect of the equalization control to be executed by the equalization unit 30 can be improved. As a result, the chargeable and dischargeable SOC range can be increased, and the assembled battery 10 can be used more effectively. When the control map MP2 is used, the maximum SOC (MAX) may exceed the permissible upper limit SOC (UL). Therefore, the charging limitation for setting the permissible charging power Win to 0 is executed in combination. Thus, the charging and discharging of the assembled battery 10 can appropriately be controlled also in the second embodiment.

It should be understood that the embodiments disclosed herein are illustrative but are not limitative in all respects. The scope of the present disclosure is defined by the claims rather than the description of the embodiments above, and is intended to encompass meanings of equivalents to the elements in the claims and all modifications within the scope of the claims.

The present disclosure provides a technology for appropriately controlling the charging and discharging of the assembled battery without exchanging the SOCs of all the cells between the battery system and the power control system.

A power control system according to a first aspect of the present disclosure is configured to exchange electric power with a battery pack (battery system). The battery pack includes an assembled battery including a plurality of cells; a voltage sensor configured to detect voltages of the cells; and a current sensor configured to detect a current input to or output from the cells. The power control system includes: a power conversion device configured to charge and discharge the assembled battery; and a controller configured to control the power conversion device, wherein the battery pack is configured to output a variation of a state-of-charge value among the cells to the controller, the variation being determined based on at least one of a detection result from the voltage sensor or a detection result from the current sensor, and the controller is configured to control the power conversion device such that a maximum state-of-charge value among a plurality of the state-of-charge values of the cells calculated based on an output of the battery pack is lower than an upper limit of a predetermined state-of-charge range and a minimum state-of-charge value among the state-of-charge values of the cells is higher than a lower limit of the predetermined state-of-charge range, the maximum state-of-charge value and the minimum state-of-charge value being values based on the variation.

In the aspect described above, the controller may be configured to: calculate a first representative state-of-charge value based on one of the maximum state-of-charge value and the minimum state-of-charge value and based on a difference between the maximum state-of-charge value and the minimum state-of-charge value, the first representative state-of-charge value being a single state-of-charge value representative of the state-of-charge values of the cells; and control the power conversion device such that the first representative state-of-charge value is equal to or lower than the upper limit and equal to or higher than the lower limit.

In the aspect described above, the controller may be configured to calculate the first representative state-of-charge value such that: the first representative state-of-charge value is equal to the lower limit when the minimum state-of-charge value is equal to the lower limit; the first representative state-of-charge value is equal to the upper limit when the minimum state-of-charge value is equal to a value obtained by subtracting the difference from the upper limit; and the first representative state-of-charge value increases monotonously between the lower limit and the upper limit.

According to the aspect described above, the variation in the SOCs among the cells is output to the controller of the power control system (HV ECU described later). The controller can control the charging and discharging of the assembled battery based on the maximum SOC and the minimum SOC calculated based on the variation in the SOCs. For example, the controller may use the first representative SOC, which is the single SOC representative of the SOCs of the cells. Although details are described later, the configuration described above achieves SOC management in which the SOCs of all the cells do not fall out of the SOC range. According to the configuration described above, the charging and discharging of the assembled battery can appropriately be controlled without exchanging the SOCs of all the cells.

In the aspect described above, the battery pack may be configured to further output an average state-of-charge value of the cells to the controller, and the controller may be configured to: calculate the first representative state-of-charge value when a ratio of a first difference between the average state-of-charge value and the minimum state-of-charge value to a second difference between the maximum state-of-charge value and the average state-of-charge value is lower than a reference value; calculate, when the ratio is higher than the reference value, a second representative state-of-charge value such that: the second representative state-of-charge value is equal to the lower limit when the minimum state-of-charge value is equal to the lower limit; the second representative state-of-charge value is equal to the upper limit when the minimum state-of-charge value is equal to the upper limit; and the second representative state-of-charge value increases monotonously between the lower limit and the upper limit; control the power conversion device such that the second representative state-of-charge value is higher than the lower limit; and prohibit charging of the assembled battery when the maximum state-of-charge value reaches the upper limit.

According to the configuration described above, the first representative SOC and the second representative SOC are selectively used depending on the relationship between the ratio and the reference value (in other words, whether an abnormal cell exists as described later). When the ratio is higher than the reference value, the second representative SOC is used, and therefore an effect of equalization among the cells can be improved (details are described later). As a result, the SOC range available for charging and discharging can be increased, and the assembled battery can be used more effectively. When the second representative SOC is used, the maximum SOC may exceed the upper limit of the SOC. In this case, the charging is prohibited. Thus, the charging and discharging of the assembled battery can be controlled appropriately.

An electric powered vehicle according to a second aspect of the present disclosure includes the power control system and the battery pack.

An electric powered vehicle according to a third aspect of the present disclosure includes a battery system and a power control system configured to exchange electric power with the battery system. The battery system includes: an assembled battery including a plurality of cells; a voltage sensor configured to detect voltages of the cells; a current sensor configured to detect a current input to or output from the cells; and a first controller configured to receive detection results from the voltage sensor and the current sensor, the power control system includes: a power conversion device configured to charge and discharge the assembled battery; and a second controller configured to control the power conversion device, the first controller is configured to output a variation of a state-of-charge value among the cells to the second controller, the variation being determined based on at least one of a detection result from the voltage sensor or a detection result from the current sensor, and the second controller is configured to control the power conversion device such that a maximum state-of-charge value among a plurality of the state-of-charge values of the cells calculated based on an output of the first controller is lower than an upper limit of a predetermined state-of-charge range and a minimum state-of-charge value among the state-of-charge values of the cells is higher than a lower limit of the predetermined state-of-charge range, the maximum state-of-charge value and the minimum state-of-charge value being values based on the variation.

According to the configurations of the second and third aspects, the charging and discharging of the assembled battery can appropriately be controlled without exchanging the SOCs of all the cells between the battery system and the power control system similarly to the configuration of the first aspect.

A power control method according to a fourth aspect of the present disclosure is a method for exchanging electric power between a battery system and a power control system. The battery system includes: an assembled battery including a plurality of cells; a voltage sensor configured to detect voltages of the cells; a current sensor configured to detect a current input to or output from the cells; and a first controller configured to receive detection results from the voltage sensor and the current sensor, and the power control system includes: a power conversion device configured to charge and discharge the assembled battery; and a second controller configured to control the power conversion device. The power control method includes: outputting a variation of a state-of-charge value among the cells from the first controller to the second controller, the variation being determined based on at least one of a detection result from the voltage sensor or a detection result from the current sensor; and controlling the power conversion device by the second controller such that a maximum state-of-charge value among a plurality the state-of-charge values of the cells calculated based on an output of the first controller is lower than an upper limit of a predetermined state-of-charge range and a minimum state-of-charge value among the state-of-charge values of the cells is higher than a lower limit of the predetermined state-of-charge range, the maximum state-of-charge value and the minimum state-of-charge value being values based on the variation.

According to the method of the fourth aspect, the charging and discharging of the assembled battery can appropriately be controlled without exchanging the SOCs of all the cells between the battery system and the power control system similarly to the configuration of the first or third aspect.

What is claimed is:

1. A power control system configured to exchange electric power with a battery pack,
the battery pack including:
an assembled battery including a plurality of cells;
a voltage sensor configured to detect voltages of the cells; and
a current sensor configured to detect a current input to or output from the cells,
the power control system comprising:
a power conversion device configured to charge and discharge the assembled battery; and
a controller configured to control the power conversion device, wherein
the battery pack is configured to output a variation of a state-of-charge value among the cells to the controller, the variation being determined based on at least one of a detection result from the voltage sensor or a detection result from the current sensor, and
the controller is configured to control the power conversion device such that a maximum state-of-charge value among a plurality of the state-of-charge values of the cells calculated based on an output of the battery pack is lower than an upper limit of a predetermined state-of-charge range and a minimum state-of-charge value among the state-of-charge values of the cells is higher than a lower limit of the predetermined state-of-charge range, the maximum state-of-charge value and the minimum state-of-charge value being values based on the variation.

2. The power control system according to claim 1, wherein the controller is configured to:
calculate a first representative state-of-charge value based on one of the maximum state-of-charge value and the minimum state-of-charge value and based on a difference between the maximum state-of-charge value and the minimum state-of-charge value, the first representative state-of-charge value being a single state-of-charge value representative of the state-of-charge values of the cells; and
control the power conversion device such that the first representative state-of-charge value is equal to or lower than the upper limit and equal to or higher than the lower limit.

3. The power control system according to claim 2, wherein the controller is configured to calculate the first representative state-of-charge value such that:
the first representative state-of-charge value is equal to the lower limit when the minimum state-of-charge value is equal to the lower limit;
the first representative state-of-charge value is equal to the upper limit when the minimum state-of-charge value is equal to a value obtained by subtracting the difference from the upper limit; and
the first representative state-of-charge value increases monotonously between the lower limit and the upper limit.

4. The power control system according to claim 3, wherein
the battery pack is configured to further output an average state-of-charge value of the cells to the controller, and
the controller is configured to:
calculate the first representative state-of-charge value when a ratio of a first difference between the average state-of-charge value and the minimum state-of-charge value to a second difference between the maximum state-of-charge value and the average state-of-charge value is lower than a reference value;
calculate, when the ratio is higher than the reference value, a second representative state-of-charge value such that:
the second representative state-of-charge value is equal to the lower limit when the minimum state-of-charge value is equal to the lower limit;
the second representative state-of-charge value is equal to the upper limit when the minimum state-of-charge value is equal to the upper limit; and
the second representative state-of-charge value increases monotonously between the lower limit and the upper limit;
control the power conversion device such that the second representative state-of-charge value is higher than the lower limit; and
prohibit charging of the assembled battery when the maximum state-of-charge value reaches the upper limit.

5. An electric powered vehicle comprising:
a power control system configured to exchange electric power with a battery pack, the power control system including
a power conversion device configured to charge and discharge an assembled battery, and
a controller configured to control the power conversion device; and
the battery pack including
the assembled battery including a plurality of cells,
a voltage sensor configured to detect voltages of the cells, and
a current sensor configured to detect a current input to or output from the cells, wherein
the battery pack is configured to output a variation of a state-of-charge value among the cells to the controller, the variation being determined based on at least one of a detection result from the voltage sensor or a detection result from the current sensor, and
the controller is configured to control the power conversion device such that a maximum state-of-charge value among a plurality of the state-of-charge values of the cells calculated based on an output of the battery pack is lower than an upper limit of a predetermined state-of-charge range and a minimum state-of-charge value among the state-of-charge values of the cells is higher than a lower limit of the predetermined state-of-charge range, the maximum state-of-charge value and the minimum state-of-charge value being values based on the variation.

6. An electric powered vehicle comprising:
a battery system; and
a power control system configured to exchange electric power with the battery system, wherein
the battery system includes:
an assembled battery including a plurality of cells;
a voltage sensor configured to detect voltages of the cells;

a current sensor configured to detect a current input to or output from the cells; and a first controller configured to receive detection results from the voltage sensor and the current sensor, the power control system includes:
  a power conversion device configured to charge and discharge the assembled battery; and
  a second controller configured to control the power conversion device, the first controller is configured to output a variation of a state-of-charge value among the cells to the second controller, the variation being determined based on at least one of a detection result from the voltage sensor or a detection result from the current sensor, and the second controller is configured to control the power conversion device such that a maximum state-of-charge value among a plurality of the state-of-charge values of the cells calculated based on an output of the first controller is lower than an upper limit of a predetermined state-of-charge range and a minimum state-of-charge value among the state-of-charge values of the cells is higher than a lower limit of the predetermined state-of-charge range, the maximum state-of-charge value and the minimum state-of-charge value being values based on the variation.

7. A power control method for exchanging electric power between a battery system and a power control system, the battery system including:
  an assembled battery including a plurality of cells;
  a voltage sensor configured to detect voltages of the cells;
  a current sensor configured to detect a current input to or output from the cells; and
  a first controller configured to receive detection results from the voltage sensor and the current sensor, the power control system including:
  a power conversion device configured to charge and discharge the assembled battery; and
  a second controller configured to control the power conversion device, the power control method comprising:
  outputting a variation of a state-of-charge value among the cells from the first controller to the second controller, the variation being determined based on at least one of a detection result from the voltage sensor or a detection result from the current sensor; and
  controlling the power conversion device by the second controller such that a maximum state-of-charge value among a plurality the state-of-charge values of the cells calculated based on an output of the first controller is lower than an upper limit of a predetermined state-of-charge range and a minimum state-of-charge value among the state-of-charge values of the cells is higher than a lower limit of the predetermined state-of-charge range, the maximum state-of-charge value and the minimum state-of-charge value being values based on the variation.

* * * * *